US006900707B2

(12) United States Patent
Erlig et al.

(10) Patent No.: US 6,900,707 B2
(45) Date of Patent: May 31, 2005

(54) PHOTONIC RF PHASE SHIFTER WITH MITIGATED RF POWER FLUCTUATION AND DEVICES INCORPORATING THE SAME

(75) Inventors: Hernan Erlig, Thousand Oaks, CA (US); Harold R. Fetterman, Santa Monica, CA (US); Joseph Michael, Los Angeles, CA (US)

(73) Assignee: Pacific Wave Industries, Inc., Los Angeles, CA (US)

( * ) Notice: Subject to any disclaimer, the term of this patent is extended or adjusted under 35 U.S.C. 154(b) by 289 days.

(21) Appl. No.: 10/000,744

(22) Filed: Nov. 30, 2001

(65) Prior Publication Data

US 2003/0102938 A1 Jun. 5, 2003

(51) Int. Cl.[7] .................................................. H01P 1/18
(52) U.S. Cl. ............................... 333/156; 385/3; 385/8; 385/9; 359/237; 359/238
(58) Field of Search ........................... 333/156; 359/237, 359/238; 385/3, 8, 9

(56) References Cited

U.S. PATENT DOCUMENTS

| | | | | |
|---|---|---|---|---|
| 5,109,441 | A | * | 4/1992 | Glaab ............................. 385/1 |
| 5,701,583 | A | * | 12/1997 | Harbin et al. ................. 455/25 |
| 5,751,248 | A | * | 5/1998 | Thaniyavarn ............... 342/368 |
| 6,204,951 | B1 | * | 3/2001 | Coward et al. ............. 359/245 |
| 6,337,660 | B1 | * | 1/2002 | Esman et al. ............... 342/375 |
| 6,486,824 | B1 | * | 11/2002 | Shupe ......................... 342/16 |
| 6,555,027 | B2 | * | 4/2003 | Wang et al. ................. 252/582 |
| 6,580,532 | B1 | * | 6/2003 | Yao et al. ...................... 398/39 |
| 6,583,917 | B2 | * | 6/2003 | Melloni et al. ............. 359/245 |

OTHER PUBLICATIONS

Fetterman et al "Multiple output photonic RF phase shifters for optically controlled radar system", 2002 IEEE MTT–S Digest pp. 1937–1940.*
L. R. Dalton et al., "From molecules to opto–chips: organic electro–optic materials," *J. Mater. Chem.*, 1999, 9, 1905–1920.
S. Lee et al., "Demonstration of a Photonically Controlled RF Phase Shifter," *IEEE Microwave and Guided Wave Letters*, vol. 9, No. 9, Sep. 1999, 357–359.
H. Erlig et al., "Applications of State–of–the–Art Polymer Modulators," *OSA Conference on Integrated Photonics Research*, Monterey, CA, US, Jun. 11–13, 2001.

* cited by examiner

Primary Examiner—Benny Lee
Assistant Examiner—Kimberly Glenn
(74) Attorney, Agent, or Firm—Henricks, Slavin & Holmes LLP

(57) ABSTRACT

A power balanced photonic RF phase shifter includes: a microwave drive; a phase controller operably connected to the microwave drive; and a linearizing arm connected in parallel with the microwave drive, the linearizing arm operating under a bias voltage, $V_{lin}$, that is controlled such that power variations of the photonic RF phase shifter are mitigated. In a preferred embodiment, the bias voltage, $V_{lin}$, is controlled to keep an optical phase of the photonic RF phase shifter at a constant value. In a preferred embodiment, the microwave drive, the phase controller and the linearizing arm comprise (three) Mach-Zehnder modulators.

20 Claims, 9 Drawing Sheets

PHOTONIC RF PHASE SHIFTER WITH MITIGATED RF POWER FLUCTUATION AND DEVICES INCORPORATING THE SAME

BACKGROUND OF THE INVENTION

1. Field of Invention

The present invention relates generally to photonic radio frequency (RF) phase shifter and, more specifically, to photonic RF phase shifter with mitigated RF power fluctuation and devices incorporating the same.

2. Description of the Related Art

The implementation of phased array systems for radar and communication applications is hindered by the need for complex RF feed structures. See, J. Cowards, T. Yee, C. Chalfant, and P. Chang, "A Photonic Integrated-Optic RF Phase Shifter for Phased Array Antenna Beam-forming Applications," *IEEE J. of Lightwave Technology*, vol. 11, no. 12, 1993, pp. 2201–5, incorporated herein by reference. Photonic approaches to beam forming have been identified as possible replacements for conventional complex and costly RF corporate feeds. Photonic RF phase shifters are important components of such photonic microwave signal-processing approaches. For example, a prior photonic RF phase shifter architecture initially proposed by Soref and demonstrated by Kamiya et al. and Lee et al. is flexible and easily implementable in that it does not require multiple detection elements, incoherent light sources, etc. See: R. Soref, "Voltage-Controlled Optical/RF Phase Shifter," *J. of Lightwave technology*, vol. 3, no. 5, 1985, pp. 992–8; S. Lee, A. Udupa, H. Erlig, H. Zhang, Y. Chang, C. Zhang, D. Chang, D. Bhattacharya, B. Tsap, W. Steier, L. Dalton, and H. Fetterman, "Demonstration of a Photonically Controlled RF Phase Shifter," *IEEE Microwave and Guided Wave Lett.*, vol. 9, no. 9, 1999, pp. 357–9; and S. Lee, A. Udupa, H. Erlig, H. Zhang, Y. Chang, C. Zhang, D. Chang, D. Bhattacharya, B. Tsap, W. Steier, L. Dalton, and H. Fetterman, "Demonstration of a Photonically Controlled RF Phase Shifter," *IEEE Microwave and Guided Wave Lett.*, vol. 9, no. 9, 1999, pp. 357–9, all of which are incorporated herein by reference. However, this RF phase shifter structure suffers from the deficiency of experiencing large RF power fluctuations as the RF phase is tuned. Moreover, the RF phase of this structure changes non-linearly with control phase/bias.

Referring to FIG. 1, the photonic RF phase shifter structure 100 demonstrated by Kamiya et al. and Lee et al. includes a frequency shifter 102 and a phase controller 104 realized in the form of two nested Mach-Zehnder modulators configured as shown. The electrodes of the upper and lower arms of the frequency shifter 102 are respectively driven with the in-phase and quadrature components derived from the same microwave source. This inner modulator acts as a single side band (SSB) modulator, with the optical frequency increasing by the amount of RF frequency ω, and is embedded within the second Mach-Zehnder modulator. The optical phase in the other arm of the outer Mach-Zehnder is modulated by the quasi-DC electrical signal $V_s$, which controls the final RF phase of the microwave field. After the two outer arms are combined, there are two different optical frequencies or wavelengths existing in the output $E_O$. When delivered to a photodetector, these two optical wavelengths provide a phase shifted RF signal through difference frequency generation. The RF signal encoded onto the optical carrier is recovered by demodulation performed with the photodetector.

The output intensity at the modulation frequency, which is responsible for the RF power generation in the photodetector, is given by $$I_{\omega,o} \propto \frac{E_i^2}{16} \cdot \{[\sqrt{2}\,J_1(\sqrt{2}\,\Delta) + 4J_1(\Delta)\sin\varphi]\sin\omega t - [\sqrt{2}\,J_1(\sqrt{2}\,\Delta) + 4J_1(\Delta)\cos\varphi]\cos\omega t\} \quad (1)$$

$$= \frac{E_i^2}{16} A(\Delta, \varphi)\cos(\omega t + \phi(\Delta, \varphi))$$

where ω is the RF modulation frequency, Δ is the RF modulation depth, φ is the optical phase produced by the control signal $V_s$, the RF photocurrent is proportional to A (Δ, φ), and φ(Δ, φ) is the RF phase of the detected signal. Where Δ and φ are related to the electrical signals by $$\Delta = \pi \frac{V_m}{V_{\pi,RF}} \quad (2a)$$

$$\varphi = \pi \frac{V_s}{V_{\pi,DC}} \quad (2b)$$

where $V_{\pi,RF}$ and $V_{\pi,DC}$ are the RF and DC half-wave voltage, respectively. From (1), A and φ are related to Δ and φ as follows $$A(\Delta, \varphi) = \sqrt{\left(\sqrt{2}\,J_1(\sqrt{2}\,\Delta) + 4J_1(\Delta)\sin\varphi\right)^2 + \left(\sqrt{2}\,J_1(\sqrt{2}\,\Delta) + 4J_1(\Delta)\cos\varphi\right)^2} \quad (3a)$$

$$\tan\phi(\Delta, \varphi) = \frac{\sqrt{2}\,J_1(\sqrt{2}\,\Delta) + 4J_1(\Delta)\sin\varphi}{\sqrt{2}\,J_1(\sqrt{2}\,\Delta) + 4J_1(\Delta)\cos\varphi} \quad (3b)$$

From (3b), it can be seen that the microwave phase can be controlled by changes in φ (control phase) or changes in the control bias, $V_s$. FIG. 2 shows calculation results based on (3b) for three different values of RF modulation depth, Δ. For Δ equal to 2.7, the RF phase is linearly dependent on the control phase; however, to achieve this condition requires a considerable amount of RF drive power, $V_m = (2.7/\pi)V_{\pi,RF}$. Moreover, at this drive level signal distortions are likely from the generation of first and second harmonics.

As disclosed in Lee et al., in order to avoid the generation of harmonics and signal distortion, Δ is set to ≦1, small signal operation. As Δ is reduced below 2.7, the linear dependence of the microwave phase on control phase disappears and it is replaced by a strong non-linear dependence.

Under small signal operation, in addition to the non-linear dependence of microwave phase on control phase, the generated RF power varies with microwave phase. See, D. Jez, K. Cearns, and P. Jessop, "Optical Waveguide Components For Beam Forming in Phased-Array Antennas," *Microwave and Optical Technology Letters*, vol. 15, no. 1, 1997, pp. 46–49, incorporated herein by reference. The generated microwave power is given by $$P_g = \frac{1}{2} R_d \{R P_o A(\Delta, \varphi)\}^2 \quad (4)$$

where $P_g$ is the generated microwave power at ω, $R_d$ is the detector impedance, R is the detector responsivity, and $P_o$ is the product of the input optical power and the optical insertion loss. FIG. 3 shows calculations based on (4) for the case of Δ equal to 1. In the power calculation, the following parameters were assumed: $R_d$=50Ω, R==1 A/W, and $P_o$=1 mW. As seen from the figure, the generated microwave power varies by up to 12 dB as the microwave phase varies over 2π. This is highly undesirable for the photonic control of phased arrays.

Mathematically, this detrimental effect arises from the terms containing $J_1(\sqrt{2}\Delta)$ in (3a). Physically, these terms arise from mixing of the optical frequency shifter arms. Under appropriate operating conditions, the optical frequency shifter is also a single side band modulator. See, M. Izutsu, S. Shikama, and T. Sueta, "Integrated Optical SSB Modulator/Frequency Shifter," *IEEE Journal of Quantum Elect.*, vol. QE-17, no. 11, 1981, pp. 2225–2227, which is incorporated herein by reference. The RF phase shifter structure of FIG. 1 cannot compensate for this effect and results in degraded shifter performance. Accordingly, it would be helpful in a photonic RF phase shifter structure (for photonic control of phase array systems among other things) to be able to reduce the microwave power variation as the microwave phase is tuned.

SUMMARY OF THE INVENTION

The RF/microwave phase shifter structure ("power balanced photonic RF phase shifter") of the present invention provides an additional degree of freedom for device operation in the form of a linearizing arm operated under a DC bias, $V_{lin}$, that is controlled to keep an optical phase of the photonic RF phase shifter at a constant value such that power variations of the photonic RF phase shifter are mitigated. In an exemplary preferred embodiment, the linearizing arm takes the form of a Mach-Zehnder modulator.

The additional degree of freedom provided by the power balanced photonic RF phase shifter substantially mitigates microwave power variation as microwave phase is tuned over 2π. A greater than 10-fold reduction in power fluctuation makes the power balanced photonic RF phase shifter suitable for photonic control of phase array systems. In addition to reduced power fluctuation, the power balanced photonic RF phase shifter provides a near linear transfer function for microwave phase.

In accordance with one embodiment of the present invention, a power balanced photonic RF phase shifter includes: a microwave drive; a phase controller operably connected to the microwave drive; and a linearizing arm connected in parallel with the microwave drive, the linearizing arm operating under a bias voltage, $V_{lin}$, that is controlled such that power variations of the photonic RF phase shifter are mitigated. In a preferred embodiment, the bias voltage, $V_{lin}$, is controlled to keep an optical phase of the photonic RF phase shifter at a constant value. In a preferred embodiment, the constant value is 5/4π.

In accordance with another embodiment of the present invention, a power balanced photonic RF phase shifter includes: a microwave drive; a phase controller operably connected to the microwave drive; and a linearizing arm connected in parallel with the microwave drive, the linearizing arm operating under a bias voltage, $V_{lin}$, that is controlled such that an optical phase of the photonic RF phase shifter is regulated to mitigate power variations of the photonic RF phase shifter.

Preferably, for any of the disclosed embodiments, the microwave drive comprises an inner Mach-Zehnder modulator of two nested Mach-Zehnder modulators; and the inner Mach-Zehnder modulator and the linearizing arm form an outer Mach-Zehnder modulator of the two nested Mach-Zehnder modulators. Preferably, for any of the disclosed embodiments, the microwave drive, the phase controller and the linearizing arm comprise three (nested) Mach-Zehnder modulators.

Exemplary applications and systems suitable for inclusion of the power balanced photonic RF phase shifter of the present invention include: a phase sequence generator for a serially controlled phased array, a multiple output RF phase shifter for controlling an N-element array in a parallel configuration, a multiple output RF phase shifter for controlling a plurality of elements in a radar system, a quadrature amplitude modulator, and an optoelectronic oscillator.

The above described and many other features and attendant advantages of the present invention will become apparent as the invention becomes better understood by reference to the following detailed description when considered in conjunction with the accompanying drawings.

BRIEF DESCRIPTION OF THE DRAWINGS

Detailed description of preferred embodiments of the invention will be made with reference to the accompanying drawings.

DETAILED DESCRIPTION OF THE PREFERRED EMBODIMENTS

The following is a detailed description of the best presently known mode of carrying out the invention. This description is not to be taken in a limiting sense, but is made merely for the purpose of illustrating the general principles of the invention.

Figure 1:
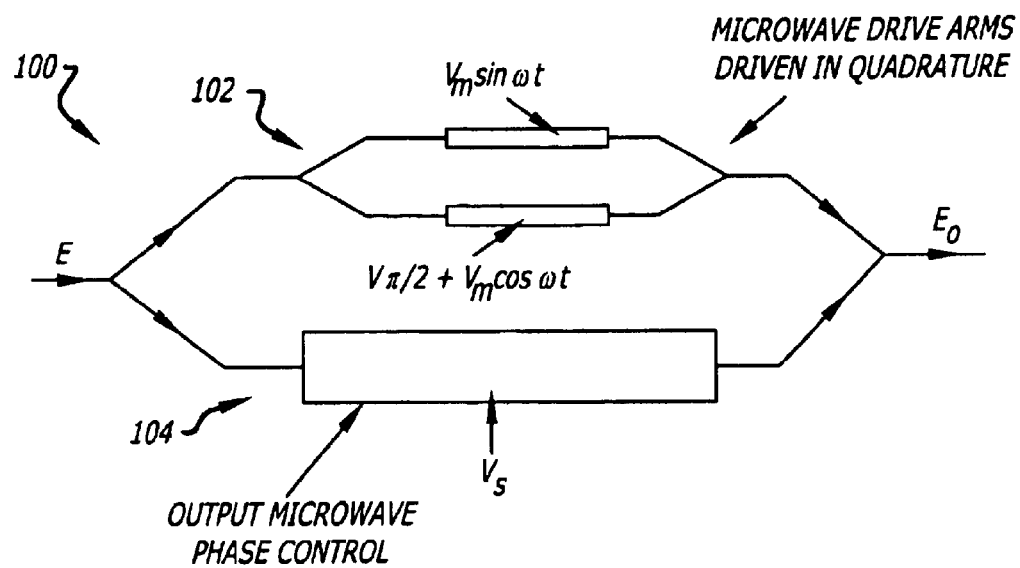
FIG. 1 is a schematic of a prior photonic RF phase shifter structure.
Figure 2:
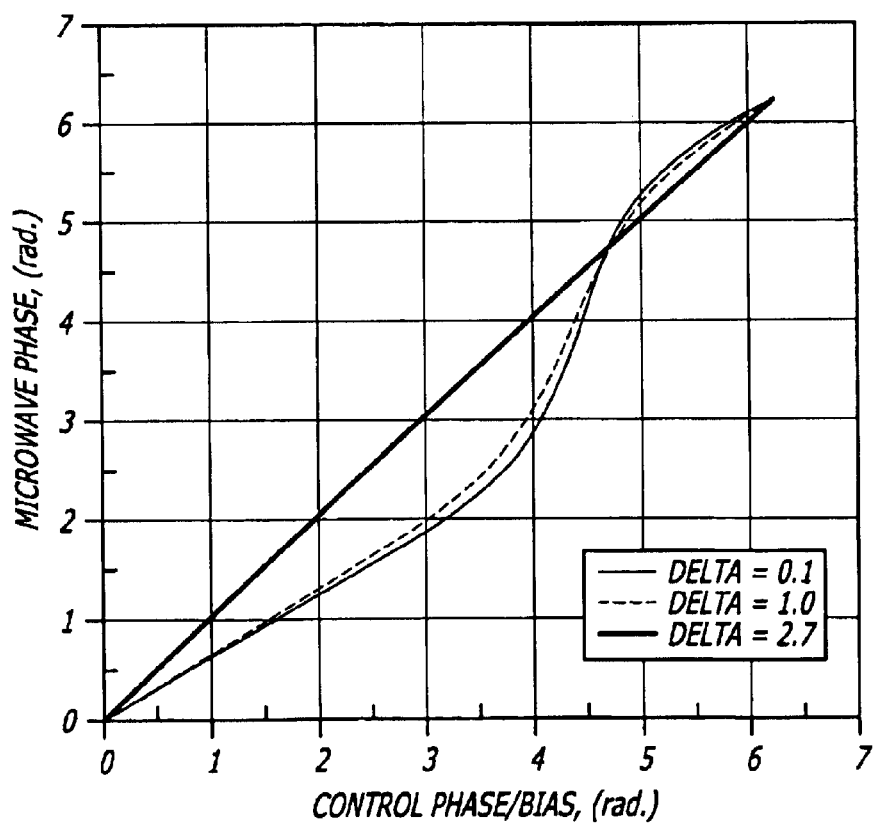
FIG. 2 is a plot of calculated microwave phase as a function of control phase for the RF phase shifter structure of FIG. 1.
Figure 3:
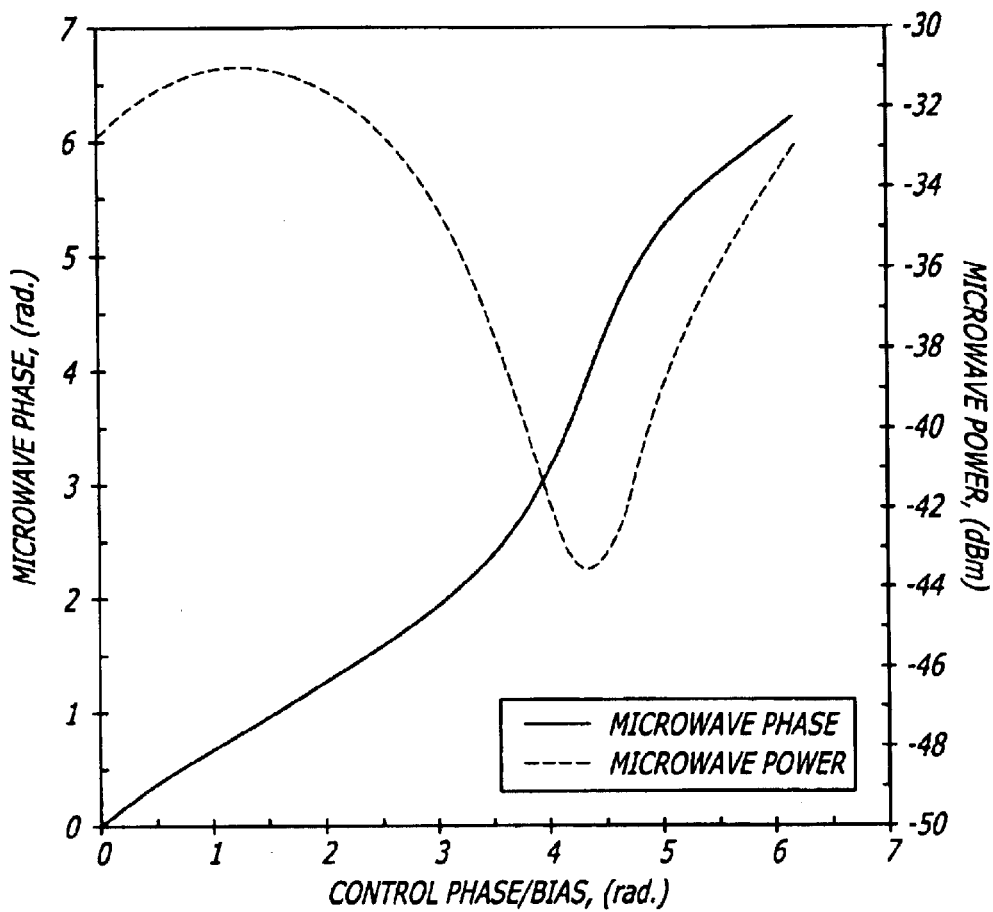
FIG. 3 is a plot of calculated microwave phase and power as a function of the control phase for the RF phase shifter structure of FIG. 1.
Figure 4:
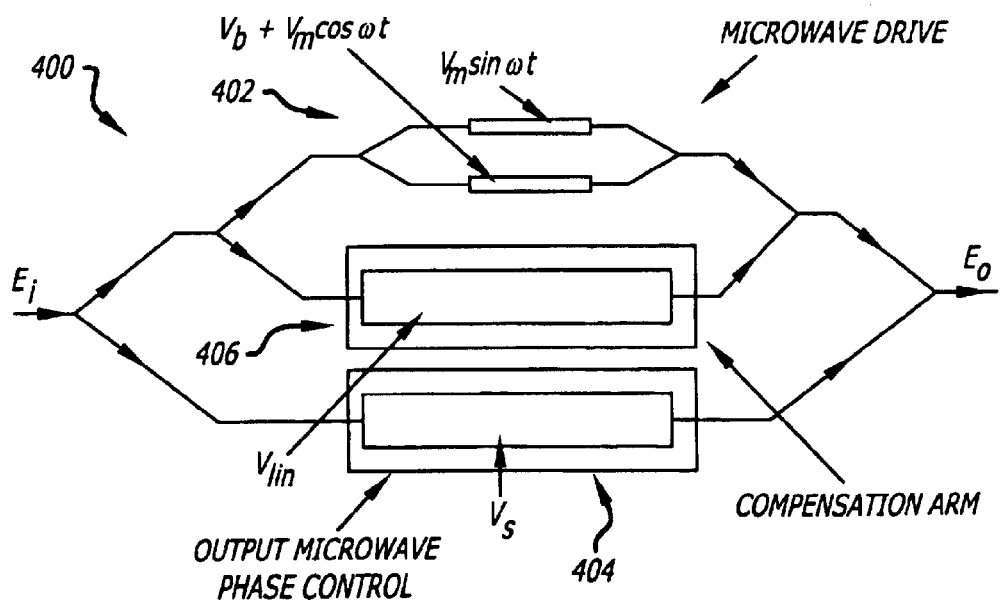
FIG. 4 is a schematic of a power balanced photonic RF phase shifter according to the present invention.

Referring to FIG. 4, a power balanced photonic RF phase shifter 400 according to the present invention includes a microwave drive 402, a phase controller 404 and a linearizing arm 406 configured as shown. The illustrated exemplary phase shifter 400 includes an additional Mach-Zehnder as compared to the phase shifter 100 (FIG. 1). When properly biased, the linearizing arm 406 increases the degrees of freedom for the operation of the device and functions to substantially mitigate power variations. In the illustrated embodiment, the linearizing arm 406 is operated under DC bias, $V_{lin}$. The linearizing bias or phase, $\gamma$, is chosen to minimize the microwave power fluctuation. For the illustrated power balanced photonic RF phase shifter 400, the intensity at the modulation frequency is given by $$I_{\omega,o} \propto \frac{E_i^2}{32} \cdot \{[\sqrt{2}J_1(\sqrt{2}\Delta) + 4J_1(\Delta)\sin\gamma + 8J_1(\Delta)\sin\varphi]\sin\omega t - \quad (5a)$$
$$[\sqrt{2}J_1(\sqrt{2}\Delta) + 4J_1(\Delta)\cos\gamma + 8J_1(\Delta)\cos\varphi]\cos\omega t\}$$
$$= \frac{E_i^2}{32}B(\Delta,\varphi,\gamma)\cos(\omega t + \theta(\Delta,\varphi,\gamma))$$

$$\gamma = \pi \frac{V_{lin}}{V_{\pi,DC}} \quad (5b)$$

where the RF photocurrent is now proportional to $B(\Delta,\phi,\gamma)$ and $\theta(\Delta,\phi,\gamma)$ is the RF phase is set by the power balanced photonic RF phase shifter 400. B and $\theta$ are related to the control parameters by $$B(\Delta,\varphi,\gamma) = \quad (6a)$$
$$\sqrt{(\sqrt{2}J_1(\sqrt{2}\Delta) + 4J_1(\Delta)\sin\gamma + 8J_1(\Delta)\sin\varphi)^2 + (\sqrt{2}J_1(\sqrt{2}\Delta) + 4J_1(\Delta)\cos\gamma + 8J_1(\Delta)\cos\varphi)^2}$$

$$\tan\theta(\Delta,\varphi,\gamma) = \frac{\sqrt{2}J_1(\sqrt{2}\Delta) + 4J_1(\Delta)\sin\gamma + 8J_1(\Delta)\sin\varphi}{\sqrt{2}J_1(\sqrt{2}\Delta) + 4J_1(\Delta)\cos\gamma + 8J_1(\Delta)\cos\varphi} \quad (6b)$$

By varying $\phi$, the microwave phase is changed. However, unlike equation (3b), equation (6b) contains an additional degree of freedom in $\gamma$. By choosing $V_{lin}$ such that $\gamma=(5/4)\pi$, equation (6b) reduces to $$\tan\theta(\Delta,\varphi,\gamma) = \frac{\{\sqrt{2}J_1(\sqrt{2}\Delta) - 2\sqrt{2}J_1(\Delta)\} + 8J_1(\Delta)\sin\varphi}{\{\sqrt{2}J_1(\sqrt{2}\Delta) - 2\sqrt{2}J_1(\Delta)\} + 8J_1(\Delta)\cos\varphi} \quad (7)$$

Figure 5:
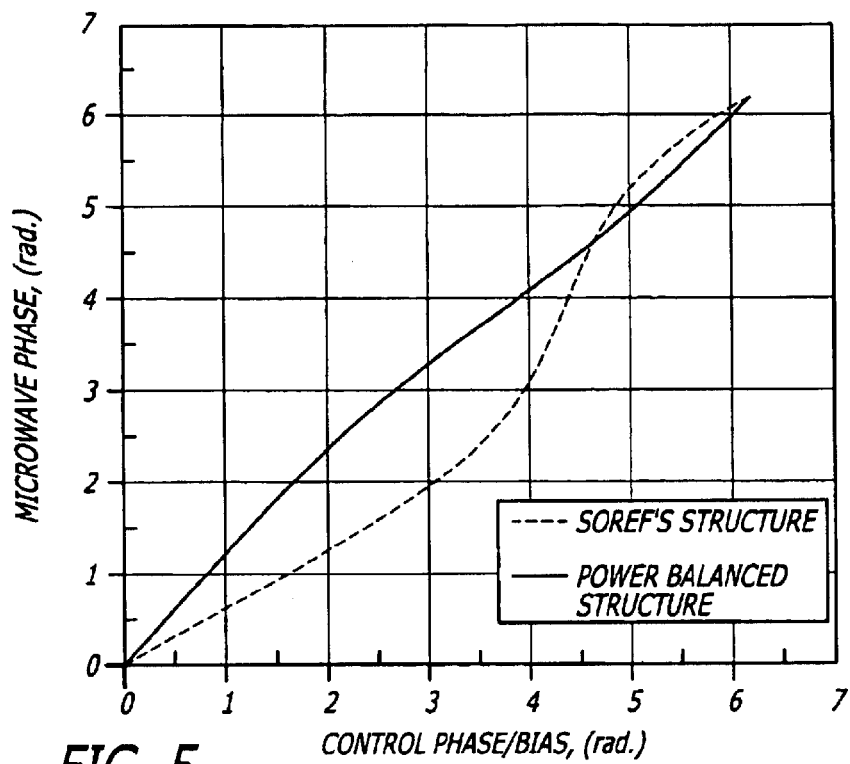
FIG. 5 shows a comparison of microwave phase plots as a function of control phase for the phase shifter structures of FIGS. 1 and 4.

Thus, the linearizing arm 406—when properly biased according to the principles of the present invention—mitigates the impact of the undesirable term. This is confirmed in FIG. 5 which compares plots of the calculated microwave phase for the phase shifter 100 (denoted "Sorefs Structure") and the power balanced photonic RF phase shifter 400 ("Power Balanced Structure") for $\Delta=1$ and $\gamma=(5/4)\pi$. The Power Balanced Structure of the present invention has a nearly linear dependence on control phase, which is a significant advantage over the prior structure, particularly for serrodyning applications. See, S. Winnall, A. Lindsay, and G. Knight, "A Wide-Band Microwave Photonic Phase and Frequency Shifter," *IEEE Transactions on Microwave Theory and Techniques*, vol. 45, no. 6, 1997, pp. 1003–6, incorporated herein by reference.

In addition to greater linearity of the phase transfer function (nearly linear transfer characteristic), the power balance structure of the present invention shows substantially reduced power fluctuations. For $\gamma=(5/4)\pi$, equation (6a) reduces to $$B(\Delta,\varphi,\gamma) = \quad (8)$$
$$\sqrt{(\{\sqrt{2}J_1(\sqrt{2}\Delta) - 2\sqrt{2}J_1(\Delta)\} + 8J_1(\Delta)\sin\varphi)^2 + (\{\sqrt{2}J_1(\sqrt{2}\Delta) - 2\sqrt{2}J_1(\Delta)\} + 8J_1(\Delta)\cos\varphi)^2}$$

Figure 6:
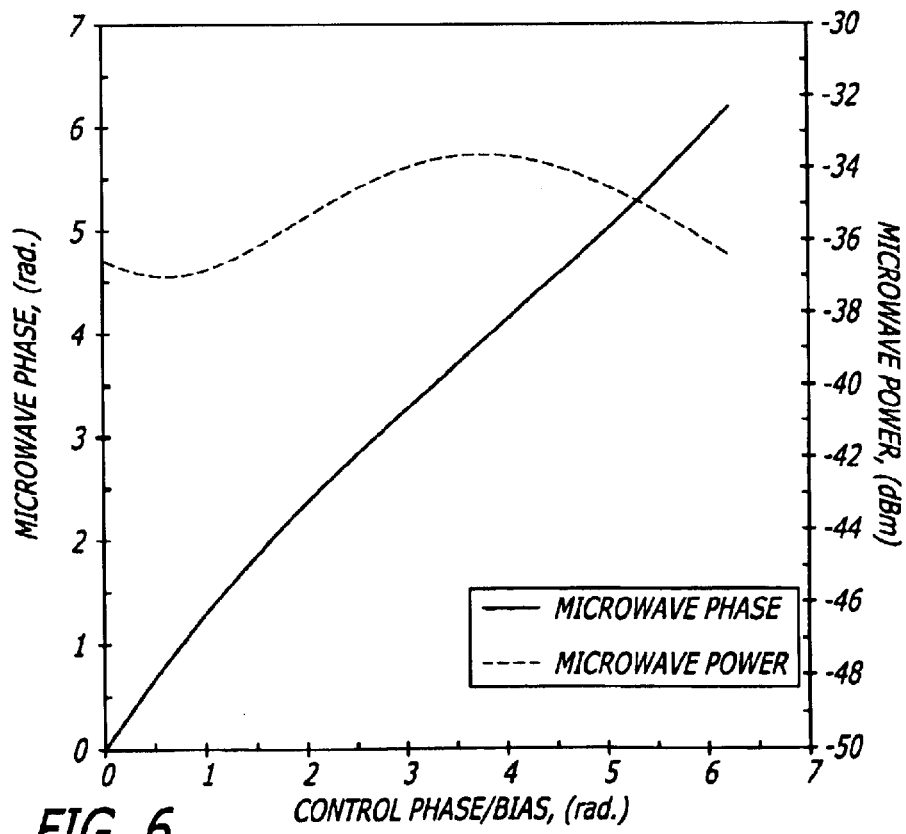
FIG. 6 is a plot of calculated microwave phase and power as a function of the control phase for the power balanced photonic RF phase shifter of FIG. 4.

Based on equations (8) and (4), FIG. 6 shows the generated microwave power as a function of control phase. In the power calculation, the following parameters were assumed: $R_d$ 50$\Omega$, R=1 A/W, $P_o$=1 mW, and $\Delta$=1. In this case, the linearizing arm maintains the microwave power fluctuation below 3.5 dB as the microwave phase is tuned over $2\pi$. This represents an improvement of nearly one order of magnitude as compared to the prior phase shifter architecture.

Figure 7A:
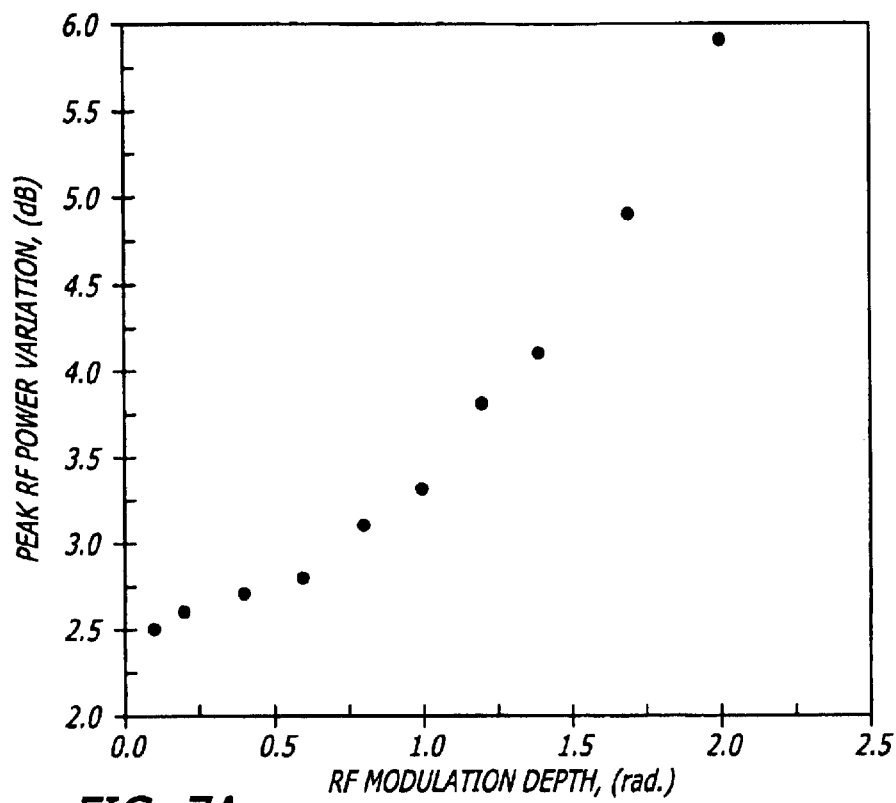
FIG. 7A shows the calculated peak RF power fluctuation as a function of RF modulation depth for the power balanced photonic RF phase shifter of FIG. 4.
Figure 7B:
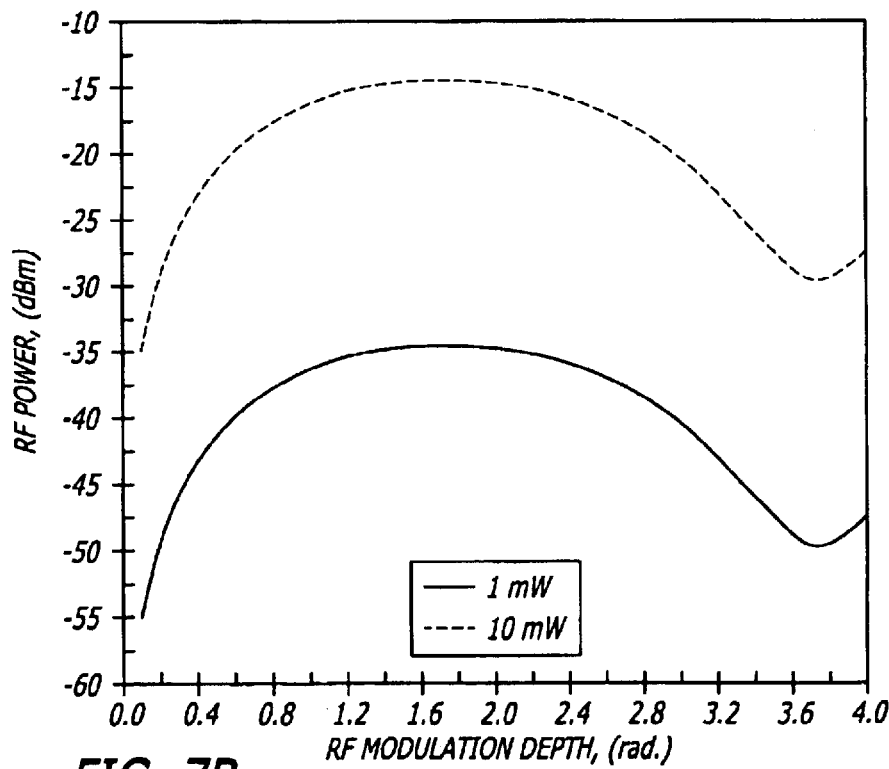
FIG. 7B shows calculated RF power as a function of Δ for two different optical powers for the power balanced photonic RF phase shifter of FIG. 4.

A consequence of the shifter geometry shown in FIG. 4 (all optical power splits are 50/50) is that the unwanted mixing term may not be exactly canceled. According to the present invention, determining an effective range of $\Delta$ involves a compromise between minimizing peak RF power fluctuation and maximizing electrical-to-optical-to-electrical conversion. FIG. 7A shows the calculated peak RF power fluctuation as a function of RF modulation depth. As the RF modulation depth decreases, entailing a more accurate small signal approximation, the RF power fluctuation decreases. Therefore, in order to ensure minimal RF power fluctuation, $\Delta$ should be made as small as possible. However (and referring to FIG. 7B which shows calculated RF power as a function of $\Delta$ for two different optical powers), as $\Delta$ decreases below 1.7 the electrical-to-optical-to-electrical power conversion efficiency decreases for ($\phi$=0. Although the optimal value of RF modulation depth is application specific, as a general guideline, choosing $\Delta\sim1$ translates to a peak RF power fluctuation smaller than 3.5 dB with a "penalty" (defined as reduction in RF power compared to maximum value and quantified in dB) not exceeding 2 dB for the conversion efficiency.

In addition to the issues discussed above, the choice of $\Delta$ determines the harmonic distortion levels. For the power balance structure with $\gamma=5\pi/4$ the intensity of the first harmonic is given by $$I_{2\omega,o} \propto \frac{E_i^2}{32}\{4[\cos\gamma - \sin\gamma] + 8[\cos\varphi - \sin\varphi]\}J_2(\Delta)\cos2\omega t \quad (9a)$$
$$= \frac{E_i^2}{4}J_2(\Delta)[\cos\varphi - \sin\varphi]\cos2\omega t$$

while the intensity of the second harmonic is given by $$I_{3\omega,o} \propto \frac{E_i^2}{32}\left\{\begin{array}{l}(-\sqrt{2}[J_3(\sqrt{2}\Delta) + 2J_3(\Delta)] + 8J_3(\Delta)\sin\varphi)\sin3\omega t + \\ (-\sqrt{2}[J_3(\sqrt{2}\Delta) + 2J_3(\Delta)] + 8J_3(\Delta)\cos\varphi)\cos3\omega t\end{array}\right\} \quad (9b)$$

Figure 8:
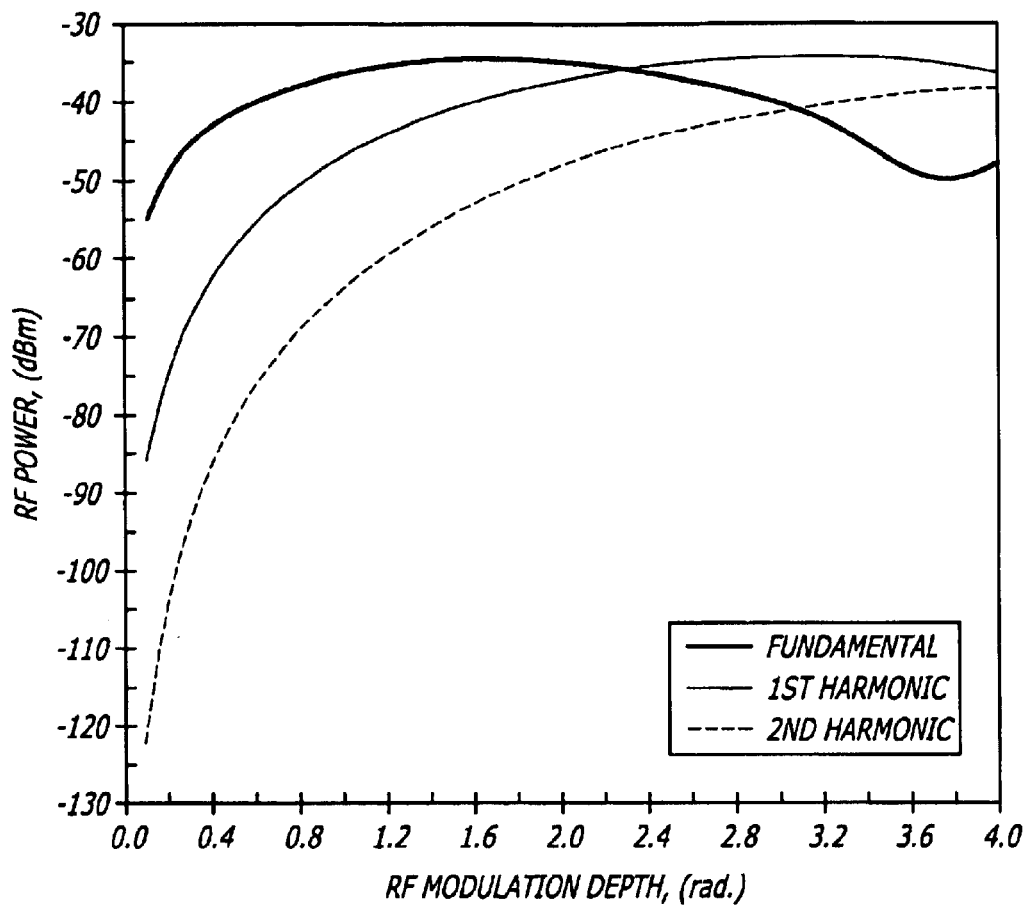
FIG. 8 shows the calculated RF power for the fundamental, ω, first harmonic, 2ω, and second harmonic, 3ω, as a function of RF modulation depth for the power balanced photonic RF phase shifter of FIG. 4.

FIG. 8 shows the calculated RF power for the fundamental, $\omega$, first harmonic, 2$\omega$, and second harmonic, $3\omega$, as a function of RF modulation depth for $\phi=0$. These calculations assume 1 mW reach the receiver. By use of the general guideline, $\Delta \sim 1$, this ensures a fundamental to first harmonic ratio of 10 dB.

The structure discussed in relation to FIG. 4 assumes all equal optical power splitting. Under this condition, the unwanted mixing term is not exactly canceled out, even under small signal operation. However, if the optical power splitting is appropriately adjusted then the cancellation becomes possible under small signal operation. By adjusting the optical splitting and recombining ratios, e.g., by appropriately trimming the optical waveguide with a laser or employing electronic scaling, it is possible for the power balance photonic RF phase shifter to exactly cancel the unwanted mixing term under "small signal" operation. This ensures complete elimination of the RF power fluctuation and a linear RF transfer function characteristic.

Although it has been observed that the power balanced photonic RF phase shifter 400 works better for small signal operation, it should be appreciated that the principles of the present invention are not limited to small signal operation. By way of example, and referring again to FIGS. 7A. 7B and 8, in order to keep harmonic distortion at a minimum and electrical-optical-electrical conversion at a maximum it is desirable to operate with a $\Delta$ value between 1 and 2.

With regard to the definition of small signal, error comes in approximating $$J_1(\Delta) = \frac{\Delta}{2}$$

$$J_1(\sqrt{2}\,\Delta) = \frac{\Delta}{\sqrt{2}}$$

The above equations are almost exactly true only when $\Delta$ is very close to zero and as $\Delta$ increases the error in the equations increases. For example, if up to 10% error in the above equations is acceptable, then "small signal" means $\Delta \leq 0.78$.

Figure 9:
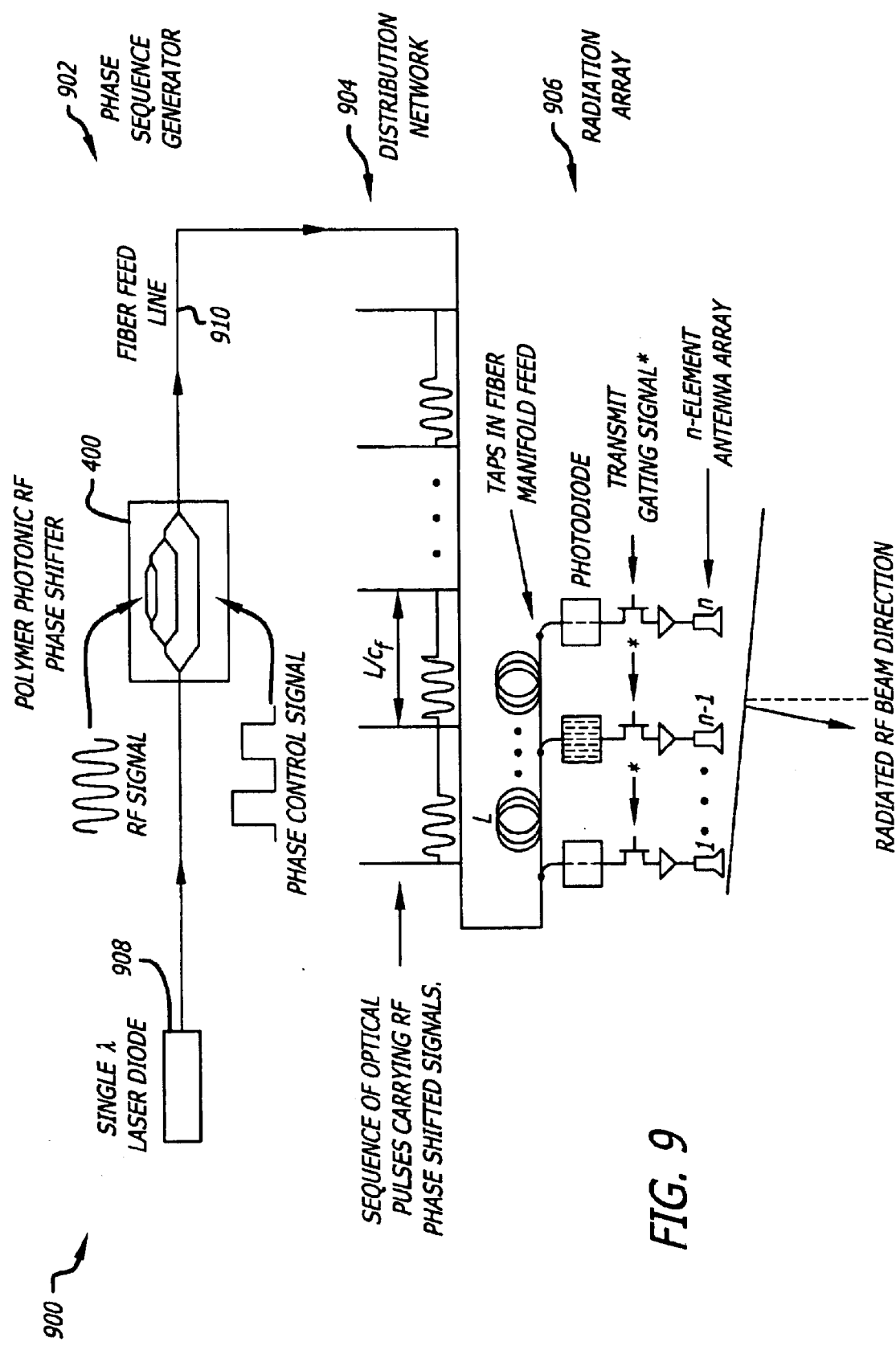
FIG. 9 is a schematic of a serially controlled phased array system that employs the power balanced photonic RF phase shifter of the present invention in its phase sequence generator.
Figure 10:
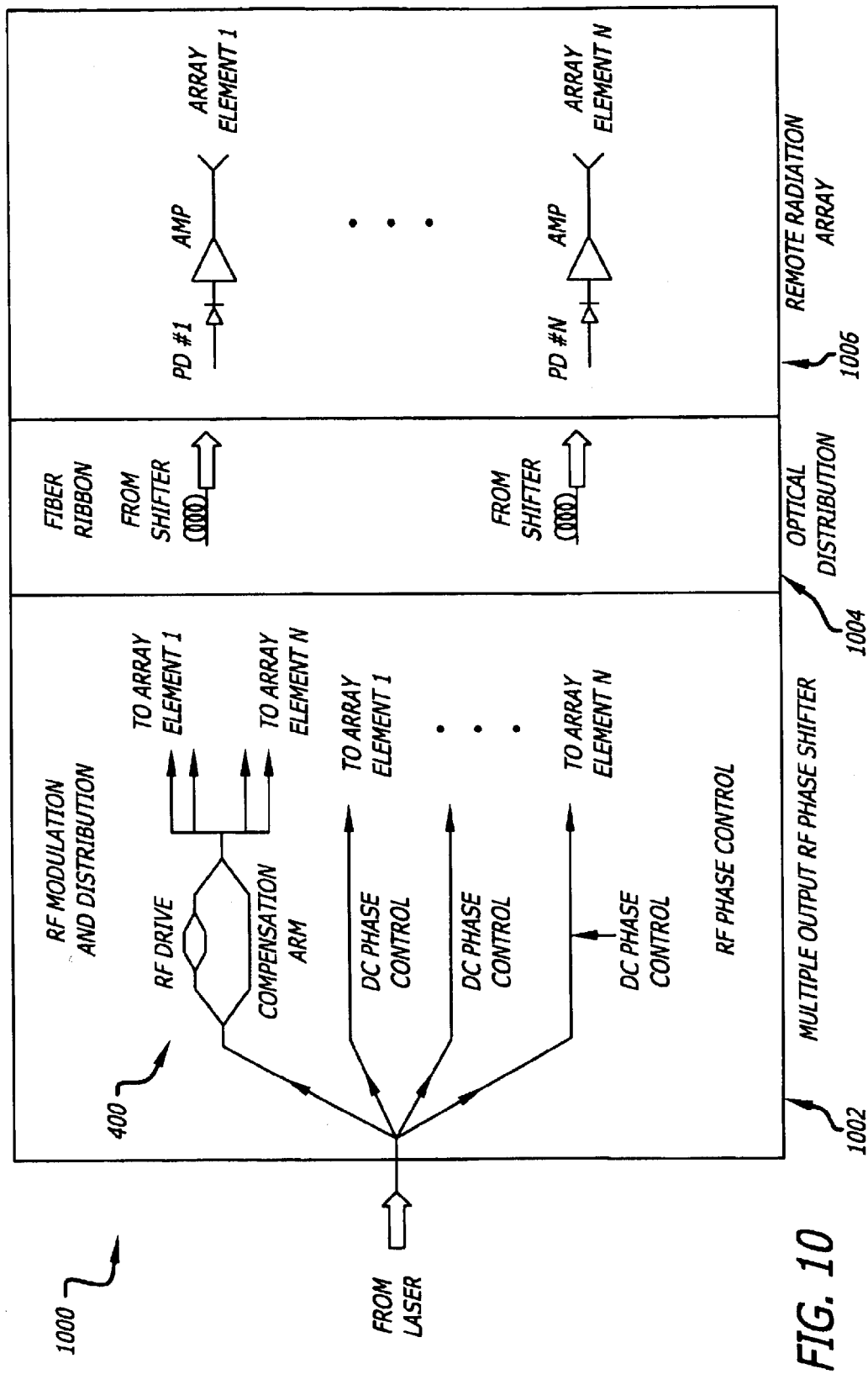
FIG. 10 is a schematic of a phased array system in a parallel configuration that employs the power balanced photonic RF phase shifter of the present invention in its multiple output RF phase shifter.

The power balanced photonic RF phase shifter 400 of the present invention is suitable for a variety of applications, including but not limited to photonic control of phase array systems such as those shown in FIGS. 9 and 10. With reference to FIG. 9, a serially controlled phased array system 900 includes a phase sequence generator 902, a distribution network 904 and a radiation array 906 configured as shown. The illustrated exemplary phase sequence generator 902 includes a laser diode 908 and the power balanced photonic RF phase shifter 400 (described above). The input to the photonic RF phase shifter 400 is provided by the laser diode 908 as shown; and the output of the photonic RF phase shifter 400 is routed to the distribution network 904 via fiber feed line 910. In the illustrated system 900, a single phase shifter with a single output controls the n-Element antenna array by providing a sequence of optical pulses carrying RF phase shifted signals.

Referring to FIG. 10, a phased array system 1000 in a parallel configuration includes a multiple output RF phase shifter 1002, an optical distribution section 1004 and a radiation array 1006 configured as shown. The illustrated exemplary multiple output RF phase shifter 1002 performs the functions of RF modulation and distribution and RF phase control and includes the power balanced photonic RF phase shifter 400 (described above). In the illustrated system 1000, an N output phase shifter controls an N element array in a parallel configuration.

With regard to materials, the power balanced photonic RF phase shifter of the present invention (and Mach-Zehnder interferometers in particular) can be fabricated from any material (systems) that demonstrate an electro-optic effect such as: electro-optic polymers, $LiNbO_3$, $LiTaO_3$, InP, and GaAs.

Figure 11:
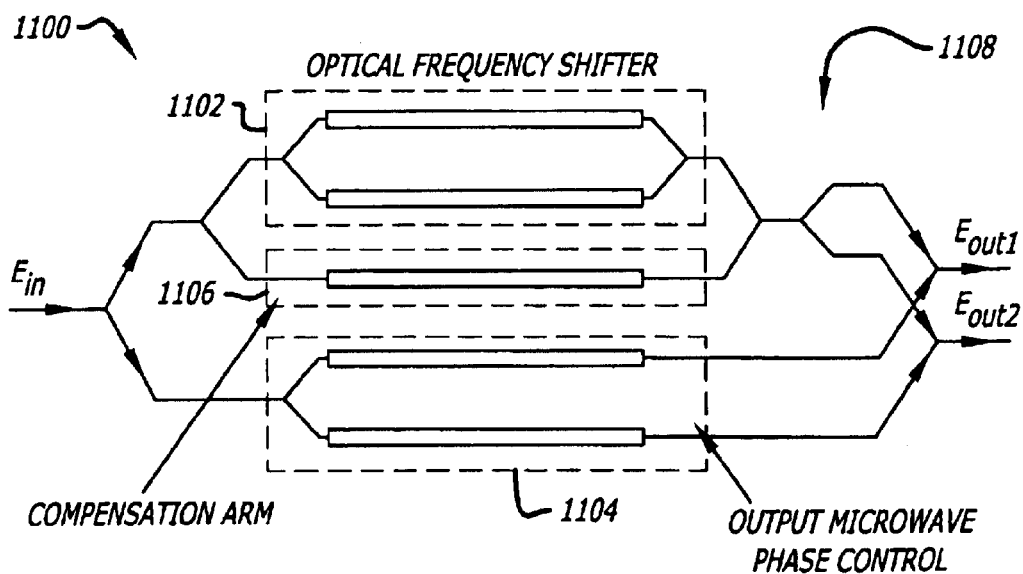
FIG. 11 is a schematic representation of a multiple output power balanced photonic phase shifter according to the present invention.

These devices are particularly well suited for implementation using polymer electro-optic materials. By using polymer optical waveguide S-bends, device length can be minimized while retaining fall functionality. Moreover, by utilizing low loss and low cross-talk polymer optical waveguide crossings, a single compensated optical frequency shifter can serve as the source for multiple phase shifter outputs. An example of this is illustrated in FIG. 11 which provides a schematic representation of a multiple output power balanced photonic phase shifter 1100 according to the present invention. The multiple output power balanced photonic phase shifter 1100 includes an optical frequency shifter 1102, an output microwave phase control 1104, a compensation arm 1106 and optical waveguide crossings 1108 configured as shown. The single compensated optical frequency shifter 1102 feeds the multiple outputs of the phase shifter 1100; this is achieved by employing the optical waveguide crossings 1108 which, in a preferred embodiment, comprise polymer optical waveguide crossings.

By appropriate control of the quasi-DC levels, the power balanced photonic phase shifter of the present invention can provide both RF phase modulation and binary modulation of the RF amplitude. Another application for the power balanced photonic phase shifter of the present invention is as a Quadrature Amplitude Modulator (QAM) for microwaves and millimeter waves. In this application, the compensation arm bias is not changed, but rather becomes a second variable capable of changing the RF phase and amplitude.

Figure 12A:
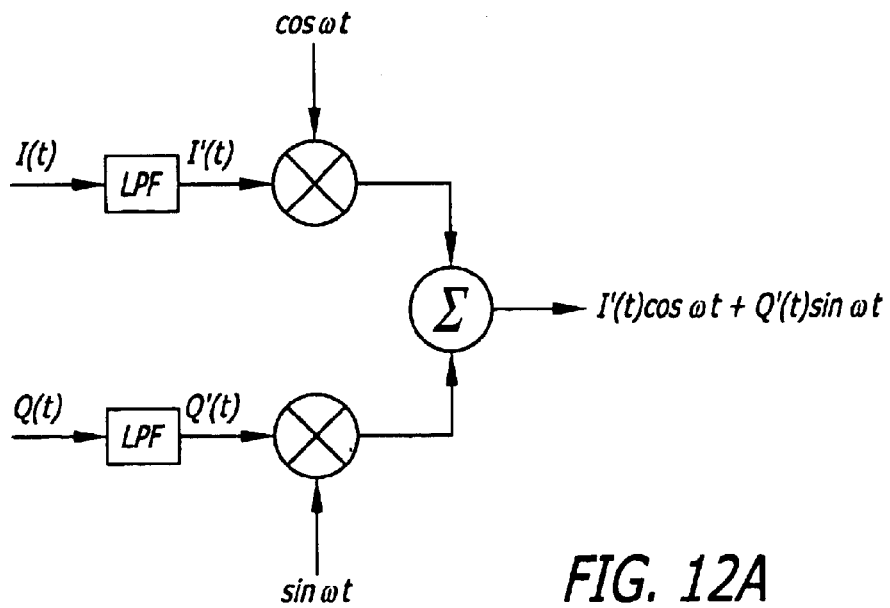
FIG. 12A shows a canonical representation of a quadrature amplitude modulator.

FIG. 12A shows a schematic diagram of a canonical representation of a QAM from B. Sklar, Digital Communications Fundamentals and Applications, Prentice Hall, New Jersey, 1988, Ch. 7, incorporated herein by reference. The transmitted data stream from this device can be represented by $$s(t)=I'(t)\cos \omega t + Q'(t)\sin \omega t \quad (10a)$$

where I'(t) is the in-phase data stream after filtering and Q'(t) is the quadrature data stream after filtering. These two data streams are independent of each other. Recalling equation (5a), the amplitude of the sin and cos terms depend both on $\gamma$ and $\phi$. If these are independent variables of time, (5a) can be re-written as $$I_{\omega,o} \propto \frac{E_i^2}{32} \cdot \{[\sqrt{2}\,J_1(\sqrt{2}\,\Delta) + 4J_1(\Delta)\sin\gamma(t) + 8J_1(\Delta)\sin\varphi(t)]\sin\omega t - \quad (10b)$$
$$[\sqrt{2}\,J_1(\sqrt{2}\,\Delta) + 4J_1(\Delta)\cos\gamma(t) + 8J_1(\Delta)\cos\varphi(t)]\cos\omega t\}$$
$$= \frac{E_i^2}{32}\{\xi(\gamma(t),\varphi(t))\sin\omega t + \zeta(\gamma(t),\varphi(t))\cos\omega t\}$$

where $\xi$ is the amplitude of the sin term and $\zeta$ is the amplitude of the cos term. Moreover, if $\gamma$ is independent of $\phi$ then $\xi$ is independent of $\zeta$. At this point, the similarities between the last line in (10b) and (10a) can be seen.

Figure 12B:
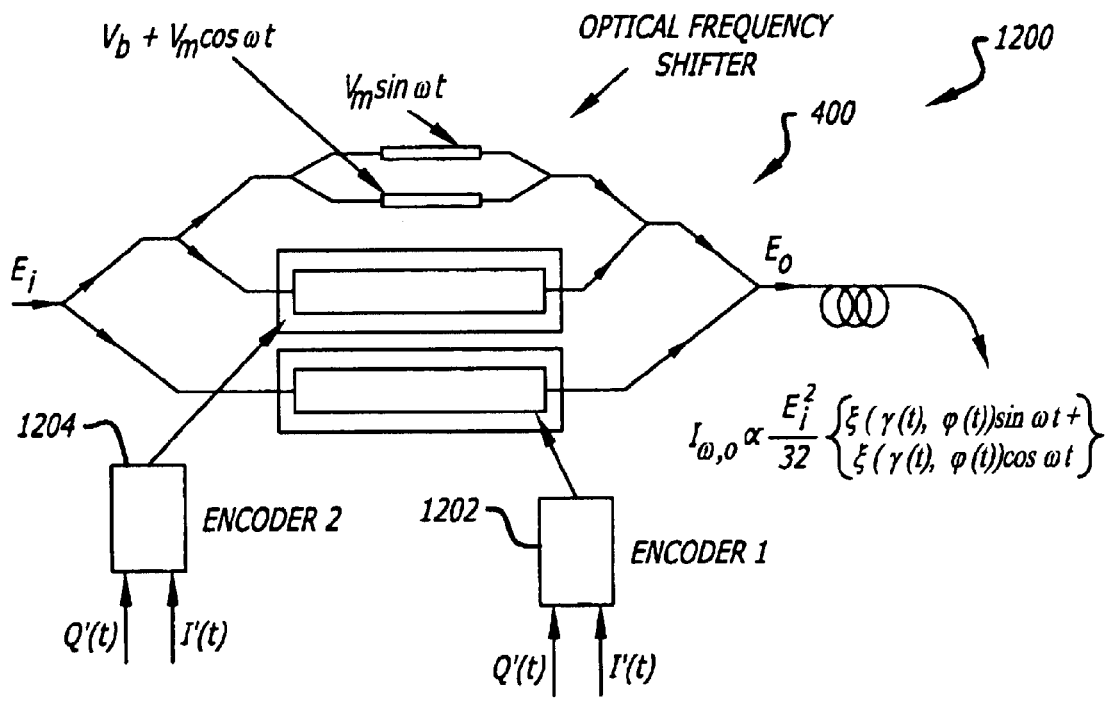
FIG. 12B is a schematic representation of an exemplary preferred quadrature amplitude modulator according to the present invention.

Referring to FIG. 12B, an exemplary preferred quadrature amplitude modulator 1200 according to the present invention includes the power balanced photonic RF phase shifter 400 (described above) and first and second encoders 1202, 1204, configured as shown. The encoders 1202, 1204 map the in-phase and quadrature data streams, (Q',I'), to the ($\zeta,\xi$) plane. The optical splitting and recombining ratios can be adjusted as discussed supra such that the intensity at the modulation frequency becomes $$I_{\omega,o} \propto \{[\sqrt{2}J_1(\sqrt{2}\Delta) + \eta J_1(\Delta)\sin\gamma(t) + \kappa J_1(\Delta)\sin\varphi(t)]\sin\omega t - \quad (11)$$
$$[\sqrt{2}J_1(\sqrt{2}\Delta) + \eta J_1(\Delta)\cos\gamma(t) + \kappa J_1(\Delta)\cos\varphi(t)]\cos\omega t\}$$

By optimizing η and κ, for the QAM application, performance of the quadrature amplitude modulator 1200 is optimized.

Figure 13:
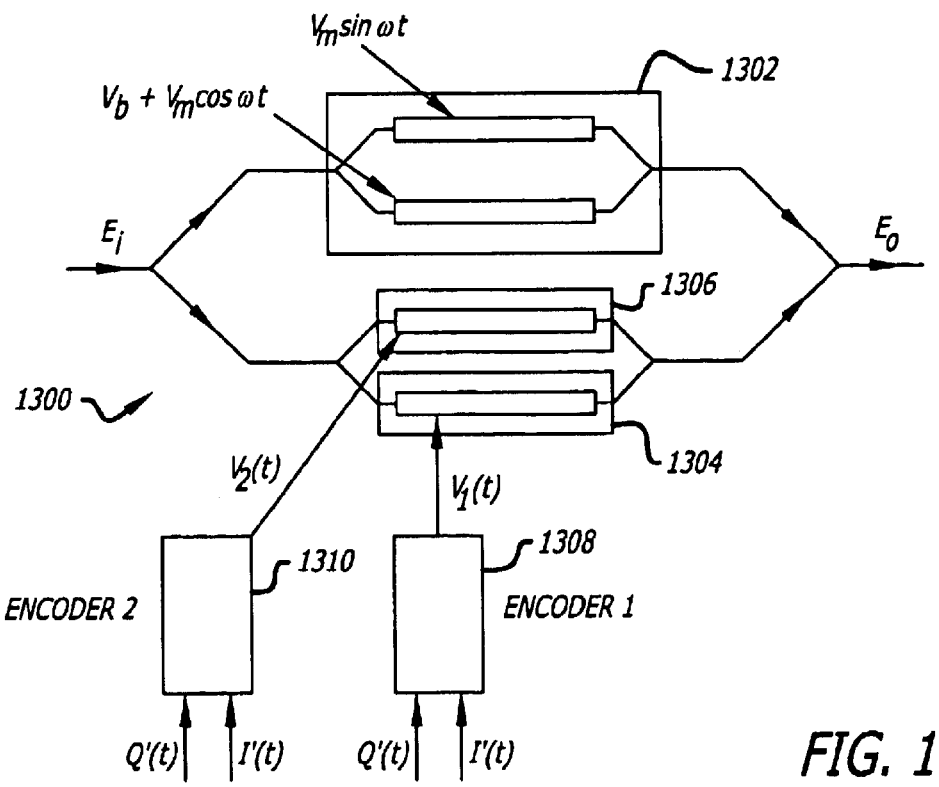
FIG. 13 is a schematic representation of an alternative exemplary preferred quadrature amplitude modulator according to the present invention.

Referring to FIG. 13, an alternative exemplary preferred quadrature amplitude modulator 1300 according to the present invention includes an optical frequency shifter 1302, an output microwave phase control 1304, a compensation arm 1306, and first and second encoders 1308, 1310, configured as shown. The output microwave phase control 1304 and the compensation arm 1306 are configured together as arms of a single modulator which, in turn, serves as an arm in an outer modulator formed with the optical frequency shifter 1302.

By extension of the QAM application, the power balanced RF photonic phase shifter of the present invention can also be used to implement quadrature phase shift keying (QPSK) or offset QPSK (OQPSK). The power balanced photonic RF phase shifter of the present invention can also be used as an RF frequency tuning element for any photonically implemented RF resonator. The power balanced photonic RF phase shifter of the present invention can also be used in optoelectronic oscillators to provide fine-tuning within one free spectral range.

Figure 14:
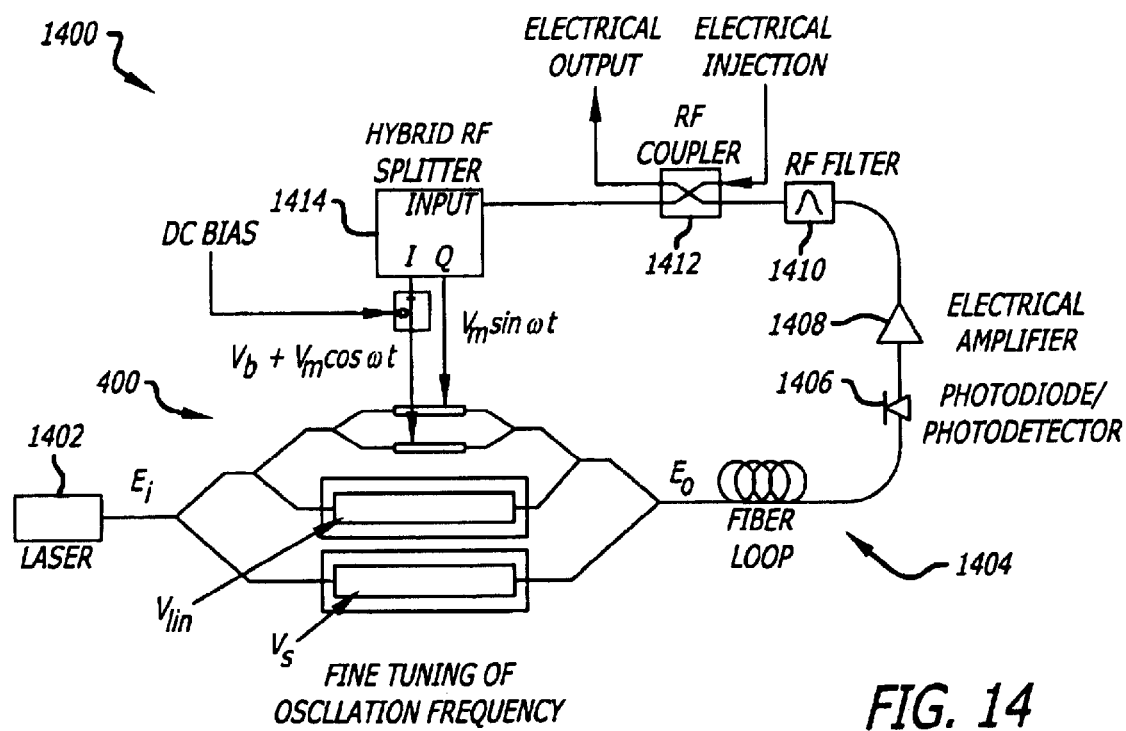
FIG. 14 is a schematic representation of an exemplary preferred optoelectronic oscillator according to the present invention.

Referring to FIG. 14, an exemplary preferred optoelectronic oscillator 1400 according to the present invention includes the power balanced photonic RF phase shifter 400 (described above), a laser 1402, a fiber loop 1404, a photodiode/photodetector 1406, an electrical amplifier 1408, an RF filter 1410, an RF coupler 1412 and an RF splitter 1414, configured as shown. In this application, the power balanced photonic RF phase shifter 400 replaces an intensity modulator. The RF is fed back to the optical frequency shifter of the RF phase shifter 400 while the control voltage port is under external control for fine-tuning of the oscillation frequency. By utilizing the power balanced photonic RF phase shifter 400 as described above, fine control of the oscillating frequency is provided. Additional information with regard to optoelectronic oscillators can be found in X. Yao and L. Maleki, "Optoelectronic microwave oscillator," *Journal of the Optical Society of America B*, vol. 13, no. 8, 1996, pp. 1725–1735, incorporated herein by reference.

Although the present invention has been described in terms of the preferred embodiment above, numerous modifications and/or additions to the above-described preferred embodiment would be readily apparent to one skilled in the art. It is intended that the scope of the present invention extends to all such modifications and/or additions.

We claim:

1. A power balanced photonic RF phase shifter comprising:
   a microwave drive;
   a phase controller operably connected to the microwave drive; and
   a linearizing arm connected in parallel with the microwave drive, the linearizing arm operating under a bias voltage, $V_{lin}$, that is controlled to keep an optical phase of the photonic RF phase shifter at a constant value such that power variations of the photonic RF phase shifter are mitigated.

2. The power balanced photonic RF phase shifter of claim 1, wherein the constant value is 5/4π.

3. The power balanced photonic RF phase shifter of claim 1, wherein:
   the microwave drive comprises an inner Mach-Zehnder modulator of two nested Mach-Zehnder modulators; and
   the inner Mach-Zehnder modulator and the linearizing arm form an outer Mach-Zehnder modulator of the two nested Mach-Zehnder modulators.

4. The power balanced photonic RF phase shifter of claim 1, wherein the microwave drive, the phase controller and the linearizing arm comprise three Mach-Zehnder modulators.

5. The power balanced photonic RF phase shifter of claim 4, wherein the three Mach-Zehnder modulators are nested.

6. A phase sequence generator for a serially controlled phased array, the phase sequence generator comprising the power balanced photonic RF phase shifter of claim 1.

7. A multiple output RF phase shifter for controlling an N-element array in a parallel configuration, the multiple output RF phase shifter comprising the power balanced photonic RF phase shifter of claim 1.

8. A multiple output RF phase shifter for controlling a plurality of elements in a radar system, the multiple output RF phase shifter comprising the power balanced photonic RF phase shifter of claim 1 and one or more optical waveguide crossings.

9. A quadrature amplitude modulator comprising the power balanced photonic RF phase shifter of claim 1.

10. An optoelectronic oscillator comprising the power balanced photonic RF phase shifter of claim 1.

11. A power balanced photonic RF phase shifter, comprising:
    a microwave drive;
    a phase controller operably connected to the microwave drive; and
    a linearizing arm connected in parallel with the microwave drive, the linearizing arm operating under a bias voltage, $V_{lin}$, that is controlled such that power variations of the photonic RF phase shifter are mitigated.

12. The power balanced photonic RF phase shifter of claim 11, wherein:
    the microwave drive comprises an inner Mach-Zehnder modulator of two nested Mach-Zehnder modulators; and
    the inner Mach-Zehnder modulator and the linearizing arm form an outer Mach-Zehnder modulator of the two nested Mach-Zehnder modulators.

13. The power balanced photonic RF phase shifter of claim 11, wherein the microwave drive, the phase controller and the linearizing arm comprise three Mach-Zehnder modulators.

14. The power balanced photonic RF phase shifter of claim 13, wherein the three Mach-Zehnder modulators are nested.

15. A phase sequence generator for a serially controlled phased array, the phase sequence generator comprising the power balanced photonic RF phase shifter of claim 11.

16. A multiple output RF phase shifter for controlling an N-element array in a parallel configuration, the multiple output RF phase shifter comprising the power balanced photonic RF phase shifter of claim 11.

17. A multiple output RF phase shifter for controlling a plurality of elements in a radar system, the multiple output RF phase shifter comprising the power balanced photonic RF phase shifter of claim 11 and one or more optical waveguide crossings.

18. A quadrature amplitude modulator comprising the power balanced photonic RF phase shifter of claim 11.

19. An optoelectronic oscillator comprising the power balanced photonic RF phase shifter of claim 11.

20. A power balanced photonic RF phase shifter, comprising:

a microwave drive;

a phase controller operably connected to the microwave drive; and a linearizing arm connected in parallel with the microwave drive, the linearizing arm operating under a bias voltage, $V_{lin}$, that is controlled such that an optical phase of the photonic RF phase shifter is regulated to mitigate power variations of the photonic RF phase shifter.

* * * * *